(12) United States Patent
Gotschall et al.

(10) Patent No.: US 9,360,516 B2
(45) Date of Patent: Jun. 7, 2016

(54) WIRELESS MULTI-SCAN WIRE IDENTIFIER

(75) Inventors: Troy W. Gotschall, Land O Lakes, FL (US); David T. Hodierne, Land O Lakes, FL (US)

(73) Assignee: SSE TECH L.L.C., Land O Lakes, FL (US)

( * ) Notice: Subject to any disclaimer, the term of this patent is extended or adjusted under 35 U.S.C. 154(b) by 826 days.

(21) Appl. No.: 13/556,332

(22) Filed: Jul. 24, 2012

(65) Prior Publication Data

US 2013/0110433 A1 May 2, 2013

Related U.S. Application Data

(60) Provisional application No. 61/552,590, filed on Oct. 28, 2011.

(51) Int. Cl.
*G01R 31/02* (2006.01)
*G08B 29/20* (2006.01)

(52) U.S. Cl.
CPC ............ *G01R 31/021* (2013.01); *G01R 31/023* (2013.01)

(58) Field of Classification Search
CPC ...... G08B 29/20; G08B 29/22; G01R 31/021; G01R 31/023
See application file for complete search history.

(56) References Cited

U.S. PATENT DOCUMENTS

| | | |
|---|---|---|
| 3,891,811 A | 6/1975 | Miller |
| 3,986,106 A | 10/1976 | Shuck et al. |
| 4,032,909 A | 6/1977 | Boyce |
| 4,095,212 A | 6/1978 | Pruitt |
| 4,121,152 A | 10/1978 | Hale et al. |
| 4,375,050 A | 2/1983 | Helgerson |
| 4,384,249 A | 5/1983 | Medina |
| 4,418,312 A | 11/1983 | Figler et al. |
| 4,736,158 A | 4/1988 | McCartney |
| 4,748,402 A | 5/1988 | Sellati |
| 4,992,739 A | 2/1991 | Kosch |
| 5,228,072 A | 7/1993 | Ingalsbe et al. |
| 5,499,196 A * | 3/1996 | Pacheco .................. 702/81 |
| 6,262,654 B1 | 7/2001 | Judd |
| 6,750,643 B2 | 6/2004 | Hwang et al. |
| 6,803,770 B2 | 10/2004 | Pereira et al. |
| 6,859,045 B2 | 2/2005 | Fernandez |
| 6,900,629 B2 | 5/2005 | Hwang et al. |

(Continued)

OTHER PUBLICATIONS

Michael LaLena, "Structured Home Wiring", 2009, Michael LaLena, pp. 1, 13 and 15.*

(Continued)

*Primary Examiner* — Gregory J Toatley
*Assistant Examiner* — Terence Stifter, Jr.
(74) *Attorney, Agent, or Firm* — Robert M. Schwartz; Kerry P. Sisselman

(57) ABSTRACT

An apparatus for identifying the location of the terminal end of one or more wire pairs in a structure having a first end at a common origin, a microprocessor sequentially scans voltage applied on the first ends of each of the plurality of wire pairs, storing in memory a value relative to the voltage reading of the selected wire pair and identifying which wire pair has a change in value to a previously stored value when a user changes the status of the second end of each wire pair at the remote location. The microprocessor sends a wireless signal to a hand held device identifying the selected wire pair with the changed status and the user located at the remote location records the physical location of the second end of the wire pair relative to the identity of the first end of the wire pair.

21 Claims, 6 Drawing Sheets

(56) References Cited

U.S. PATENT DOCUMENTS

| | | |
|---|---|---|
| 7,057,401 B2 | 6/2006 | Blades |
| 7,167,088 B2 | 1/2007 | Farley |
| 7,221,283 B1 | 5/2007 | Czarnecki |
| 7,336,061 B2 | 2/2008 | Ku et al. |
| 7,649,450 B2 | 1/2010 | Campion, Jr. et al. |
| 7,710,256 B2 | 5/2010 | Tawil |
| 2005/0280527 A1* | 12/2005 | Farley ............... G08B 29/145 340/514 |
| 2006/0255788 A1* | 11/2006 | Porcu ............... G01R 31/023 324/66 |
| 2007/0001683 A1 | 1/2007 | Krigel |
| 2008/0084291 A1* | 4/2008 | Campion et al. ............. 340/514 |
| 2009/0063678 A1* | 3/2009 | Maegawa et al. ............ 709/224 |

OTHER PUBLICATIONS

Trilithic 20 Way Coaxial Cable Mapper http://www.techtoolsupply.com/ProductDetails.asp?ProductCode=2011337000.

Extech Cable Identifier, 16 Line http://www.grainger.com/Grainger/EXTECH-Cable-Identifier-8R946 http://www.extech.com/instruments/resources/manuals/CT40_UM.pdf.

Greenless Wire Sorter 5775VS http://www.mygreenlee.com/Products/main.shtml?p_search=5775vs&greenlee_category_id=100&Submit=Find&portalProcess_2=showGreenleeProductTemplate&upc_number=34542.

* cited by examiner

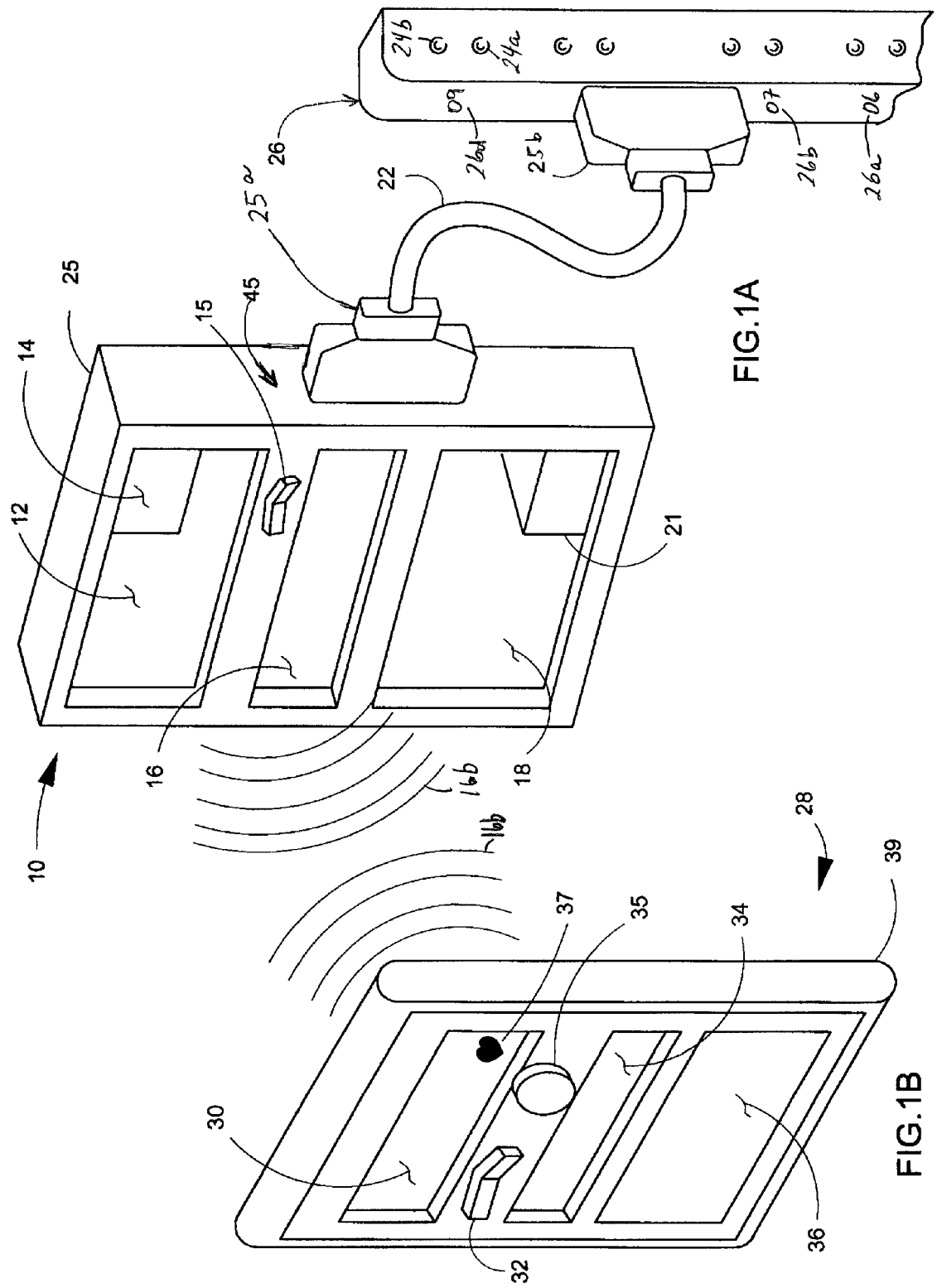

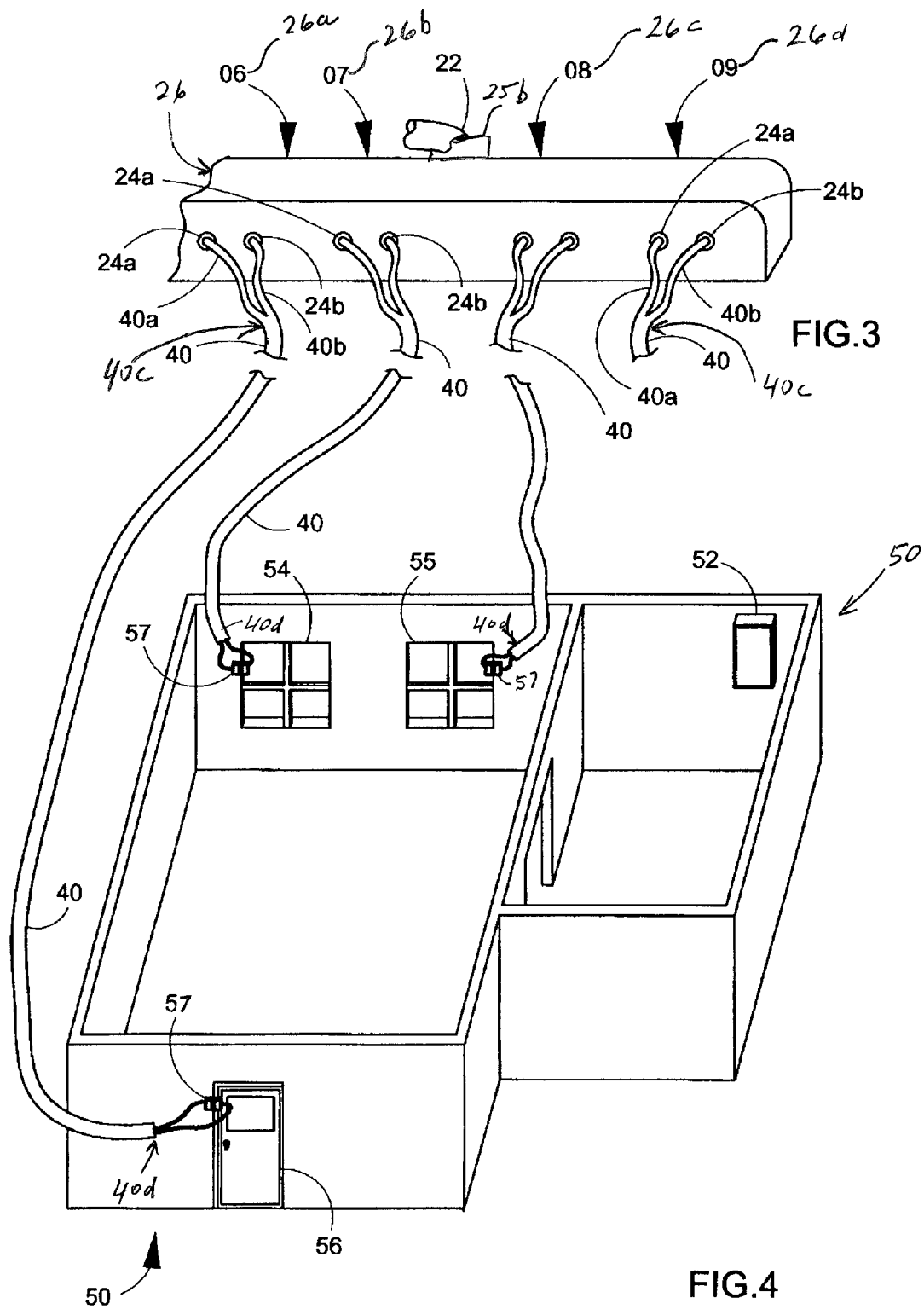

Multi-Scan Wireless Circuit Block Diagram

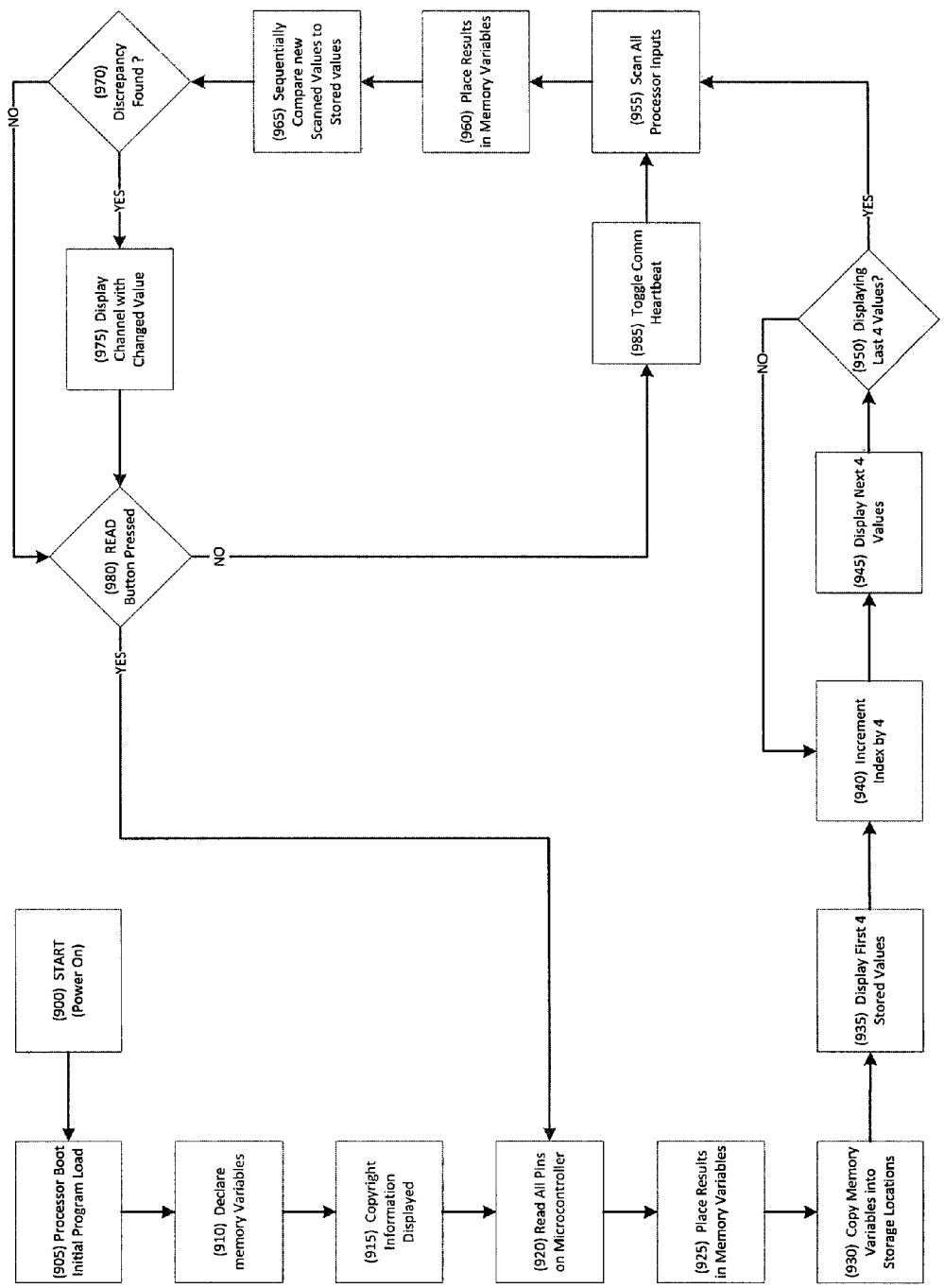

WIRELESS MULTI-SCAN WIRE IDENTIFIER

PRIORITY

This application claims the priority of U.S. Provisional Patent Application Ser. No. 61/552,590 filed Oct. 28, 2011, which is incorporated herein in its entirety.

BACKGROUND OF THE INVENTION

Typical building structures include a plurality of electrical wires and wiring passing throughout the structure. These wires typically include wire pairs running from a central or common hub location in the building to remote locations throughout the structure, also referred to as star wired topology as used herein, wire pairs may include a wire with one or more other wires associated with it, such as coax cable, cat5 cabling or any paired wiring. Initially when such wire pairs are installed, they may or may not include a wiring diagram to identify wire pair ends at the common location with the location identification and description of the wire pair at the terminal remote location. When the wiring diagram is not available or when it may be incorrect, unless the wires are well marked with such location information, it is difficult and tedious to readily determine the remote location for each wire pair from the common location.

Typically two technicians will work together, one technician at the common location and one technician, to visit each terminal end at the remote wire pair location throughout the structure to identify the wire pair ends. In such a manner the two technicians will attempt to establish an electrical connection of the wire pair between the remote location and the common location. This is very difficult because of the number of combination of wire pairs. Once a connection is established the two technicians must then communicate to one another, often by hand held radio communications or by the two technicians meeting at the common location or the remote location e.g. by walking back to the common location or by just plain yelling between each other to communicate when the connection is made and the identity of the remote location and the identity of the wire pair at the common location. This is time consuming and is a costly process involving the technicians.

The present invention provides a simple and novel apparatus and method to coordinate and identify each wire pair at the common location with the identity of the wire pair remote location. Further, the present invention can be practiced with a single technician to accomplish the same goals of mapping the location and identity of each wire pair. The instant invention may be used in a home or a building where wiring is employed such as networks and alarms and any other venues where wire pairs are used.

SUMMARY OF THE INVENTION

The present invention is a wireless multi-scan wire identifier having a base unit and a portable unit. The wireless multi-scan device provides for the identification of a plurality of wire pairs by a single technician in the least amount of time with the least amount of effort. This is possible because it eliminates trial and error methods and endless trips back to the central location to change pair connections to devices such as toners.

The invention is an apparatus and method to identify the location of the terminal end of one or more wire pairs which originate at a hub or common location such as an electrical room, wiring closet or similar location. Each of the wire pairs has a first end at the hub or common location and a second end which is located at a remote location from the common location. For example, in the case of a home alarm, the first ends of a plurality of wire pairs may be located at a hub located in the garage, and the second ends of the wire pairs may be on a window, door or the like. For simplicity, considered herein is such a system which has twenty four wire pairs, though the system could accommodate any desired number of wire pairs more or less. The first ends of each one of the twenty four wire pairs are attached and connected to an electrical connector at the hub such as a wire pair connector that makes an electrical connection with the first ends of each of one or more of the wire ends of the wire pairs at the common location. The electrical connector is in turn connected to an interface cable which is then connected to the base unit of the scanner system of the present invention. It is to be understood that the twenty four wire pairs are for example only, the instant invention can be employed with fewer wire pairs or more wire pairs.

The base unit includes a microprocessor, and a radio frequency (RF) transmitter/receiver or a transceiver. The base unit is designed to place a small voltage across each of the first ends of the wire pairs at the common location and then scan the wire pairs sequentially for continuity. Initially, the state of the second ends, the terminal ends of each of the remote wire pairs are not known. Each terminal end or second end of the wire pairs can be in one of two states, either the two ends of the wire pair at the second end are connected or closed and able to pass an electrical current there through, or the two ends are not connected or are open and are unable to pass an electrical current there through. When a voltage is placed across the first end of a wire pair at the common location, if the terminal end of the wire pair is closed, then a small current will pass through the wire pair and the microprocessor will store a value of "one" in a memory location in the base unit memory reserved for that wire pair. Conversely, if the current does not pass through the wire pair, the circuit is open and a value of "0" (zero) will be stored in the memory location reserved for that wire pair.

The microprocessor communicates digitally with each of the first ends of the wire pairs through an input channel when the microprocessor is first initialized. The microprocessor initialization process zeroes the program memory and boots into the program. Voltage is applied across each wire pair connection while the base unit cyclically measures the voltage for each wire pair and then the microprocessor stores the state of each wire pair in memory as either open by storing a "zero" value in memory for that wire pair or closed by storing a "one" value in memory for that wire pair. Thereafter the base unit cyclically scans the wire pairs sequentially comparing the value just measured to the previous measured value stored in memory to determine if there was a change in state from the prior measurement and value stored. By way of example, if the remote location of the wire pair was in an open condition, e.g. the second ends were not connected, there would be no current flow when the voltage is placed across that particular wire pair channel and a "zero" would be stored in the particular memory location corresponding to that wire pair location identified on the wire pair connector. Alternatively, if the remote location for that wire pair was in a closed condition, there would be current flow when the voltage is placed across that wire pair and a "one" would be stored in the particular memory location for that wire pair. After the initial status values are stored in memory, the base unit continuously scans each wire pair and compares their present status with the status stored in memory. If there is a discrepancy in these compared values, e.g. the initial read is "one" and on a subsequent scan a "zero" is read, then there is a change of condition or status for that wire pair.

In addition to the base station, there is a hand held wireless remote unit containing an RF (wireless) transmitter/receiver or transceiver interfaced to an LCD or other type of read out on the remote unit. Upon initialization, the base unit sends to the wireless receiver of the hand held remote unit the results of the first scan for each of the wire pairs. This is displayed on the LCD screen. The invention is not limited solely to an LCD screen, any type of display of alpha-numeric characters may be employed. Even an audio device could provide the needed information and identity about the status of each wire pair and which wire pair had a change of status.

In use, as the base unit continuously scans the multiple wire pairs measuring the voltage across each wire pair comparing present value or status of each wire pair to the status previously stored in memory, an electrician, technician, home user or other user will proceed to any of the remote ends of the wire pairs. At the remote location, the user will change the status of the wire pair at the remote location, e.g. either from open to closed or from closed to open. This may be done, for example if a remote location were a window with a wire pair connected to a magnetic switch, and the technician opens the window, to change the state of that one wire pair end from closed to open. Because the microprocessor continuously scans the twenty four wire pairs, it will detect that the wire pair just affected has changed state in real time substantially when it happens. This change of state of the wire pair is detected by the microprocessor, the identity of the wire pair with the changed state is identified according to the location on the wire pair connector and corresponding input channel and then that identity is transmitted to the handheld device, e.g. wire pair 07 has a change of status. This communication of information from the base unit to the handheld unit identifying the wire pair that had a change of status is by the RF radio signal from the base unit transceiver to the handheld unit transceiver and then this information is displayed on the hand held unit LCD display. This information about the change of status includes an identity of the wire pair and allows the technician to make a notation of the identity of the wire pair that had a change of condition e.g. wire pair 07, and then the user can simultaneously note and recorded e.g. the "window location" for the identified wire pair or other such identification of the location where the user is located and where the second end of the wire pair is located.

The notation may be made on a special uniform pad, or may merely be recorded in some fashion either mechanically or electronically that wire pair number 07 connects to the "kitchen window" for example. In this example prior to the change the stored value would be "one," the current flows through the wire pair circuit when the voltage is applied across wire pair 07, and after the window is moved or opened, the measured value would be a "zero," since the wire pair circuit was broken by opening of the window. When the measured value of the state of a designated wire pair is compared to the stored value of that same wire pair and there is a change, e.g. the status value just measured will not be the same as the status value stored in memory, and then there has been an identification of a wire pair that has a changed state. Prior thereto, though wire pair 07 was connected to the "kitchen window", this information would not have been known, since there was no wire pair diagram available or other identification on the first end of wire pair 07 relating it two the second location of this wire pair.

In an alternate embodiment recording of the identified wire pair 40 can be done electronically, such as entering the information on an electronic tablet such as a smart phone or electronic tablet. Additionally, the identified wire pair 40 recording can be within an application program on a smart phone or electronic tablet device.

The present invention allows a single technician to walk around a premise, structure, house or building and uniquely identify and record the location identity of each wire pair while the technician is at the particular wire pair remote termination location. The technician changes the state of the wire pair circuit at the particular wire pair remote termination location, from open or closed, e.g. the "kitchen window" having a window sensor, can be opened or closed to change the status, or a wire pair with bare wire ends can be connected or disconnected to change the state of the wire pair. When the status is changed, the base unit communicates the identity of which wire pair at the common location (the wiring closet, hub or other analogous location) has had a change of state. The technician can then record the identification of the remote location while at the remote location without having to return to the common location (the wiring closet or other analogous location) to determine which wire pair has a changed status and without requiring a second technician located at the base station. This invention may be employed to locate media wires, computer wires, telephone wires or any other wires or communication means by attaching the appropriate interface cable to the base unit.

BRIEF DESCRIPTION OF THE DRAWINGS

FIG. 1A is a schematic perspective view of the base unit transceiver of the wire pair identifier and wire connector for receiving the first ends of a plurality of wire pairs.

FIG. 1B is a schematic perspective view of the hand held wireless base unit transceiver of the wire pair identifier with LCD display screen.

FIG. 3 is a schematic perspective view of a wire pair connector located at the hub or common location for connecting the first ends of the wire pairs at the common location with a distinctive numerical identifier for each connected wire pair.

FIG. 4 is a schematic perspective view of a structure having there within wire pairs running from a hub or central or common location to remote locations.

FIG. 7 is a flow chart of the base unit microprocessor program logic.

DETAILED DESCRIPTION OF THE INVENTION

Figure 1C:
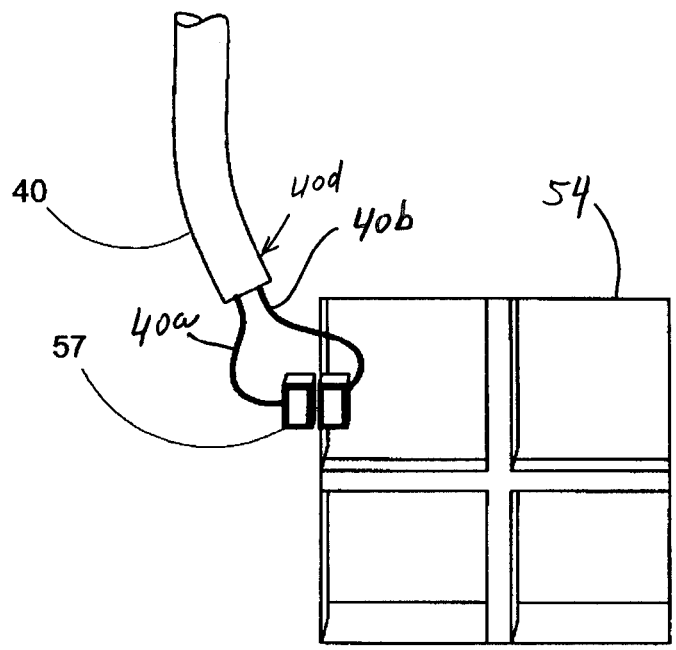
FIG. 1C is a schematic view of a window with the remote second end of one of the wire pairs which are to be identified and a magnetic switch between the wire pair and the window.

FIG. 1A is a schematic view of a base unit 10 which is electrically connected to a wire pair connector 26 by an interface cable 22 between said base unit 10 and said wire pair connector 26. Wire pair connector 26 is constructed and arranged to receive and connect to a plurality of wire pairs 40. The base unit 10 and wire pair connector 26 would be located at the hub or common location 52 of the wire system in a building structure 50. The base unit 10 allows for input and output of signals from a microprocessor 12 in base unit 10 through cable 22 to each of the wire pairs 40. Cable 22 is connected at one end to base unit 10 and its other end to wire pair connector 26. Cable 22 is a twenty five conductor wire cable with a db 25 male connector 25a on one end and a db25 female connector 25b on the other end. Connector 25a is connected to base unit 10 and connector 25b to wire pair connector 26.

Base unit 10 includes a voltage source 21. When the voltage is applied to a wire pair 40, a current may flow in a wire pair 40 of the selected wire pair 40, which allows the processor 12 to determine the state of that respective one of the wire pairs 40 and initially store that information in a memory 14 at a specific location there-within for each measured wire pairs 40. The specific memory location would be coordinated to the wire pair identified location on the wire pair connector 26 e.g. location 07. As shown in FIG. 3, each wire pair 40 is connected to wire pair connector 26 at an identifiable position. For example identifier 26a is wire pair position 06, 26b is wire position 07, 26c is wire pair position 08 and 26d is wire position 09.

Base unit 10 also includes a power source 18 for powering microprocessor 12, and power supply or voltage source 21 for applying voltage to the wire pairs 40, to power the RF transceiver 16 for transmitting and receiving communications and for powering memory 14 and any other power needs of the base unit 10. The base unit 10 also has an on/off switch 15, that when turned on initiates an initialization of the microprocessor 12. The voltage source 21 is connected to the power source 18. The components that comprise the base unit 10 are enclosed in a housing 25. The housing 25 is ergonomically designed for efficient set up and operation of the invention. It may also be non-conductive, difficult to break, and affords a modicum of protection to the components which reside within.

FIG. 1B is a schematic view of a handheld wireless remote unit 28. The handheld remote 28 includes an LCD display 30, an on/off switch 32, an RF transceiver 34 for communicating with RF transceiver 16, and a power supply 36 which provides power where needed in the remote unit 28. The handheld wireless remote 28 may also include a read button 35. When the technician/user takes the handheld wireless remote 28 to a location of a second end 40d of a wire pair 40, and changes the status of that selected wire pair 40, the read button 35 may be pressed or activated to instruct microprocessor 12 to engage a global scan including all wire pairs 40 and store the newly read voltage values for each wire pair 40 in memory 14. This allows the technician to leave the wire pair 40 in a changed state and continue on with the task of identifying the remaining wire pair 40 locations. For example, the technician finds a window that is physically open e.g. to the environment, that should be left closed. Rather than leave it open and come back later to close it, the technician can close it now while at that location, press the read button 35, this causes the microprocessor 12 to read and store new values for each wire pair 40, including the new status of the window just closed and the technician can then continue on. Other features of the handheld wireless remote 28 include an icon 37 on the LCD display 30 programmatically instructed to blink indicating communication is satisfactory with base unit 10. If the icon 37 stops blinking, it is an indication of a loss of communication between the RF transceivers 34 and 16 respectively of wireless remote 28 and the base unit 10.

The handheld wireless remote 28 also has the internal components encased in a housing 39. The housing 39 is also ergonomically designed for efficient set up and use by a technician/user during operation of the invention. Housing 39 may also be non-conductive, difficult to break, and affords a modicum of protection to the components which reside within.

In the preferred embodiment communications between the base unit 10 and the remote unit 28 is with RF transceiver 16 in the base unit 10 and RF transceiver 34 in the remote unit 28 for communicating the RF signals between the base unit 10 and remote unit 28. In an alternate embodiment other combinations of communications can be used depending on the environment of use. WI-FI™ communications (a registered trademark of the Wireless Ethernet Compatibility Alliance, Inc. of Austin, Tex.) may be used, where either or both transceiver 16 and transceiver 34 could communicate in a wireless local area network. Additionally communications can be connected to the internet (the world-wide computer network). In yet another embodiment, communications from transceiver 16 and transceiver 34 would be through cellular service communication networks or cell phones. As used herein, the term communicate would be used in its broadest meaning and not be limited to the above. Thus the present invention can be in an application program that would operate or run on a smart phone or other smart device such as telephones and electronic tablet devices such as an IPHONE® and/or an IPAD® (trademarks of Apple Inc., Cupertino, Calif.) devices. In an alternative embodiment, transceiver 16 may be only a transmitter and transceiver 34 may be only a receiver.

FIG. 1C is a representation of a remote wire pair 40 located at a window 54 such as the "kitchen window" 54 shown in FIG. 4. Window 54 is in a closed position in a structure 50. The technician would open the window 54 to change the state of the second end 40d of one of the wire pairs 40 which are located within or at least associated with the building 50 having the plurality of wire pairs 40. The window includes a magnetic switch 57 which connects to the terminal end or second end 40d of a wire pair 40. As seen in FIG. 1C second end 40d of wire pair 40 includes two wires 40a and 40b. As further shown in FIG. 1C, wires 40a and 40b are connected to one another through magnetic switch 57 and therefore wire pair 40 would have a closed status, with the window 54 in a closed position. Upon application of a voltage to the first end 40c of this wire pair 40, a current would flow through wire 40a through switch 57 and through wire 40b. When window 54 is opened, switch 57 would correspondingly open and the circuit of wire pair 40 would be open and the next cyclical measurement of this wire pair 40 for window 54 would show no circuit flow when the voltage is applied by the base unit 10 and therefore an open status. When this open status is compared to the prior reading stored in memory, there would be a change in status and microprocessor 12 would issue a communication to the remote unit 28 LCD display 30 of the change of status of wire pair 40 for window 54 including information with the corresponding position identifier of this wire pair 40 connected to wire pair connector 26 at e.g. 26b position 07.

FIG. 4 is a schematic representation of a building or a structure 50 having one or more wire pairs 40 having an origination point at a hub or common location 52, such as a wiring closet. In this structure 50 is a window 54 a second window 55 and a door 56. Each of the said windows 54 and 55 and said door 56 includes a magnetic sensor switch 57 connected to the terminal ending or second end 40d of a wire pair 40. Typically for a burglar alarm system that would be a magnetic switch 57 that would have two parts as known in the art to make a connection when the two parts are in close proximity and there would be no connection when the two parts are not in close proximity, such as when the window or door was open. Other types of magnetic switches 57, also known as and as used herein, an electrical device at the terminal ends of wire pairs 40 could include but not be limited to magnetic switches, motion detectors, glass breakage detection devices, key pads, wall jacks and cables. As previously explained the second ends 40d of wire pairs 40 may be connected to such a switch 57. As known in the art, other connectors and switches may connect to the second ends 40d of wire pairs 40.

In the present example of structure 50, the second end 40d or terminal end of each wire pair 40 would be connected to a sensor switch 57. The first end 40c of wire pairs 40, when using the present invention, would be connected to the wire pair connector 26 located in the common location 52 as shown in the example structure 50 discussed herein, though the same would apply for any structure 50 of any size and for any number of wire pairs 40. In addition, in the event the wires are not yet terminated, as may be the case in new construction, the bare wires can be shorted together causing the multi-scan unit to indicate a change in state for identification.

FIG. 3 is a schematic of a portion of wire pair connector 26. The cable 22 provides an electrical connection between base unit 10 and terminal 26. Strip 26 has a plurality of connectors 24a and 24b, one for each wire pair 40, to receive the first end 40c of wire pair 40. Wire strip 26 may have any number of connector pairs 24a and 24b, one for each wire pair 40. Shown in partial view in FIG. 3, each of the connectors 24a and 24b for each wire pair 40 have identifiable positions numbered 26a position 06, 26b position 07, 26c position 08 and 26d position 09. In the present embodiment, wire pair connector 26 has a capacity for twenty four wire pairs 40, and therefore there would be twenty four identifiable positions. The microprocessor 12 links each said identifiable position 26a, 26b, 26c and 26d etc. to a distinct location in memory 12 where the status of that wire pair 40 is stored.

Each wire pair 40 is connected to wire pair connector 26 with at least one and likely two wires ends 40a and 40b of wire pair 40. Such that wire end 40a would connect to connector 24a and wire end 40b would connect to connector 24b. In the event a wire pair 40 was a cat5 cable, having more than two wire strands therein, only two of the wire strands would be necessary to be connected to wire pair connector 26. Likewise in the event a wire pair 40 had only a single wire, but used a common ground for a part of the wire pair 40, then the single wire would attach to wire pair connector 26, connector 24a and the common ground to connector 24b.

Figure 5:
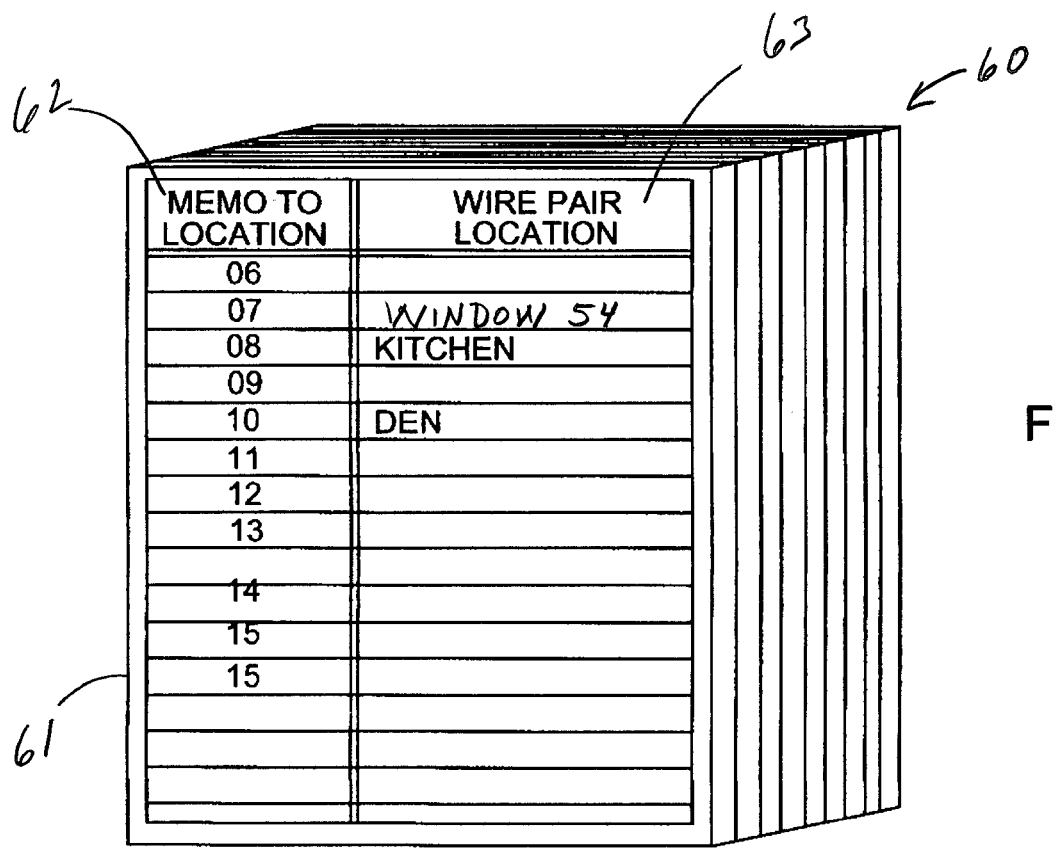
FIG. 5 is a pad of paper sheets that a user may manually record the description and location of the remote wire ends of the wire pairs based on the first end of the wire pair location on the wire pair connector.

In use, the instant invention will provide identity and location information about a wire pair 40, by providing the unique identifier 26a position number e.g. 07 of the first end 40c of a wire pair 40 and the identity and location of the associated second end 40d of that wire pair 40 located at a remote location e.g. at window 54. Once identified, the technician would record the location results in a convenient fashion such as on a preprinted paper form sheet 61 as shown in FIG. 5, as the invention herein provides the identity and location of the individual wire pairs 40 and remote ends 40d one by one. A clipboard or other device may be employed for neatness and ease of use and there may be several sheets 61 to form a pad 60 which could be held on a clipboard (not shown). However, it is contemplated that a specialized form may be utilized, which would include all salient information, for instance, which remote location is associated with which each wire pair 40, the address or location of the search, the name of the technician or company providing the service, any difficulties or unusual noteworthy events and the like. This is merely one possible form such as shown in FIG. 5 and is no way limiting to any future form design. Referring to FIG. 5, sheet 61 includes a column 62 where to list the identifiable position location of the first wire end 40c of wire pairs 40 connected to wire pair connector 26. A second column 63 would include space to list the description of the remote locations, e.g. the second ends 40d of wire pairs 40, e.g. kitchen. Upon completion sheet 61 will contain the information regarding the location of each wire pair.

The voltage applied to all wire pairs 40 is from a common voltage source 21. When a remote end 40d of wire pair 40 is in a closed position, a current will pass through the individual wire pair 40 and the microprocessor 12 senses voltage across the two ends, 40a and 40b of a wire pair 40 being measured. The microprocessor 12 is configured such that all wire pairs 40 are seen as a digital input through a designated input channel, internal within the microprocessor 12. When the microprocessor 12 detects a voltage on a wire pair 40, it interprets this as an "on" condition. The microprocessor 12 then stores this "on" status value as a "1" in a register in a location in memory 14 corresponding to the wire pair 40 identifiable position, such as 26a being measured. If the voltage is not detected, the processor 12 interprets this as an "off" condition and stores this "off" status value as a "0" in a register in a location in memory 14 corresponding to the location being measured.

When the base unit 10 is turned on, the microprocessor 12 will apply a voltage to each wire pair 40. An initial status value, based on the initial voltage read, is stored for all wire pairs 40 which are read through the internal electronic channel. The microprocessor 12 then continuously scans each wire pair 40 and compares the voltage reading value to the stored values. If the stored value is different than the present scanned value, the processor 12 interprets this as a "changed" wire pair 40 and a change of status and the microprocessor 12 identifies the wire pair 40 that has changed by communicating the identity of the changed wire pair 40 to the remote unit 28.

The handheld unit 28 receives a serial stream of data through RF transceiver 34 that it processes and then displays to the LCD display 30 output. The RF transceiver 34 is intelligent in that it can interpret inputs from on off switch 32 and read button 35 and send them back to the base unit 10. As an alternative to the icon 37, the status value readout on the LCD display 30 is configured to blink indicating communication between the base unit 10 and the handheld unit 28 is good.

The operator/technician preferably writes the results on paper 61, presumably on a clipboard. In one embodiment, the remote unit 28 is integral to a clipboard to allow the user to support a paper 61 to write down the locations of the identified wire pairs 40. A flat magnetic strip not shown can be affixed to the base unit 10 to allow it to hang on the ferrous metal panel boxes at hub 52 that the wires typically terminate in at the central hub location. In addition, some sort of strap and hook could be employed to allow the base unit 10 to hang on non-ferrous enclosures 52 while in use.

The hardware employed in the descriptions herein of the invention is in no way limiting to the hardware that could be employed with the invention. The power supplies, battery size, current level for scanning, types of memory, microprocessor, radio transmitters, and radio receivers may be selected for specific applications, to lower manufacturing cost or simplify manufacturing. Likewise any control software, or ROM, PROM, EEPROM or any transistor or specialized circuit can be utilized.

Additionally, more powerful batteries and transceivers can be used for larger structures where there may be greater separation between the base unit 10 and the remote 28.

In one embodiment of the present invention, the first ends 40c of each wire pairs 40 are connected to an identifiable position 26a, 26b etc. on wire pair connector 26. A voltage from base unit 10 is applied across each of the wire pair 40 first ends 40*c*, wires 40*a* and 40*b* through wire pair connector 26. The microprocessor 12 at initialization then scans each of said wire pair 40 first ends 40*c* to measure any voltage across each wire pair 40 and records that reading in a distinct memory location within processor 12 for each said wire pair 40. Thereafter microprocessor 12 sequentially and cyclically reads the voltage across each of said wire ends 40*c* and compares the voltage reading to the voltage reading previously stored in memory 14 for that wire pair 40. If the present voltage reading is not the same as the prior voltage reading stored in memory 14, then the change in condition for that changed wire pair 40 is communicated from the base unit 10 to the remote unit 28. This continues until all wire pairs 40 are identified or this process repeats if the read button 35 is depressed, which causes the microprocessor 12 to repeat the initialization step of measuring the voltage and storing the voltage for each wire pair 40 until all said wire pairs 40 have been measured again. Then the process continues so that the microprocessor 12 cyclically measures the voltage of each wire pair 40 and compares the measured voltage for that wire pair 40 with the prior measured voltage stored in memory for that wire pair 40 to determine whether there is a change in status for that wire pair 40.

Figure 6:
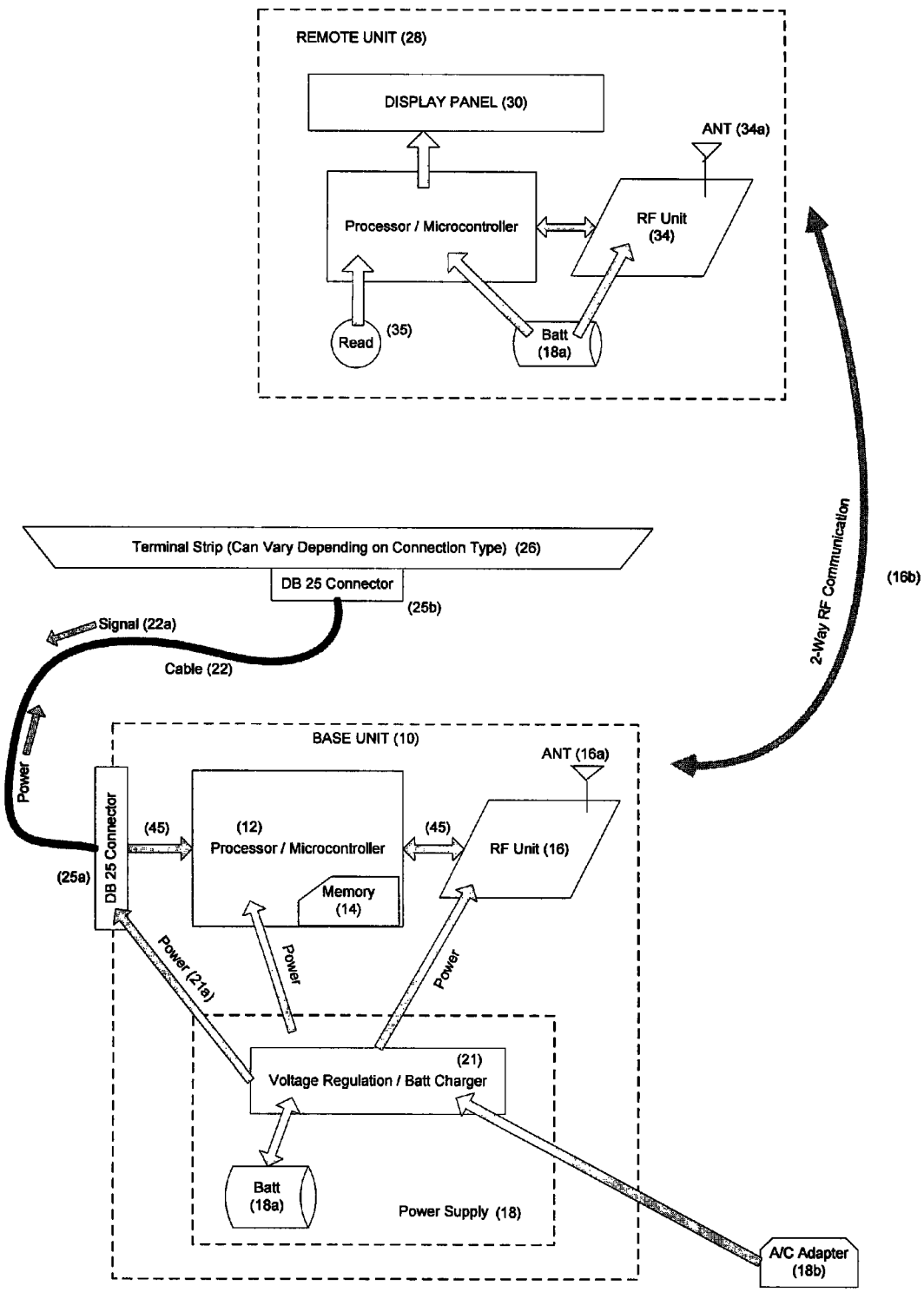
FIG. 6 is a block diagram of the wiring and circuits in the base unit and the portable unit.

Referring to FIG. 6, base unit 10 has a processor 12 with an internal memory 14. The transceiver 16 has an antenna 16*a* to transmit an RF signal 16*b* to transceiver 34 in remote unite 28 that has an antenna 34*a*. Likewise, transceiver 34 has an antenna 34*a* to transmit an RF signal 16*b* to transceiver 16. Antennas 16*a* and 34*a* can send signals or receive signals, said signals include but are not limited to RF signals, WI-FI signals and cellular telephone signals. Power source 18 can either be a battery 18*a* or power for the power source 18 can be from an A/C adaptor 18*b*. The wire pair connector 26 is connected to base unit 10 through an interface cable 22 with DB 25 connectors, where connector 25*b* attaches connector 26 and connector 25*a* to base unit 10. As shown by the arrows, power from voltage source 21 is sent in the direction of arrow 21*a* through connector 25*a* through cable 22 to wire pair connector 26 where a voltage is applied across all wire ends 40*c*. When there is an "on" status in any wire pair, there will be a voltage sensed at the processor 12 and a small amount of signal current 22*a* will flow through the wire pair 40 back to the processor 12. Voltage source 21 supplies power to processor 12 and to transceiver 16. Processor 12 communicates with transceiver 16 and wire pair connector 26 by an internal channel 45.

The batteries in the base unit 10 and the remote unit 28 may be standard replaceable batteries, rechargeable batteries or power may be obtained from any local A/C power source e.g. within a home or business, with an appropriate connection and an A/C adapter 18*b*.

Referring to FIG. 7, is shown the logic diagram of the microprocessor 12, starting at step 900 when the power on button 15 is engaged, at step 905 processor 16 boots up the initialization program which is loaded into processor memory. Step 910 memory variables are declared and at step 915 the copyright information is displayed on the LDC screen 30. Step 920 all input pins on the micro processor 12 are read. There is an input pin on microprocessor 12 for each wire pair 40 from the wire pair connector 26, such that each identifiable position 26*a*, 26*b* etc. will be associated and connected through channel 45 to an input pin on microprocessor 12.

At step 925, results form the sequential voltage reads are placed in memory at memory variables. At step 930 memory variables are copied into memory storage locations 14 associated with each wire pair 40. At step 935 the first four status values of the first four wire pairs 40 are displayed at LCD 30. At step 940 an index is incremented by 4 and at step 945 the next four status values for the next four wire pairs 40 are displayed at LCD 30. At step 950 if the last four values were not displayed step 940 is repeated. If the last four values were displayed then at step 955 all processor inputs connected to a wire pair 40 are scanned for a voltage reading. At step 960, the results of the voltage readings are placed in memory variables. At step 965 all new scanned voltage values are sequentially compared to the prior stored voltage values. At step 970 if there is a discrepancy or change in a stored voltage value then at step 975 the wire pair 40 with the changed value is displayed at LCD 30. At step 970 if there is no change in stored value e.g. no discrepancy, then at step 980 it is determined whether the read button 35 been pressed, if not then proceed to step 985 to toggle the communication heartbeat 37 and repeat step 955. At step 980 if the read button 35 has been pressed or activated, go to and repeat step 920 to store new values.

Figure 2:
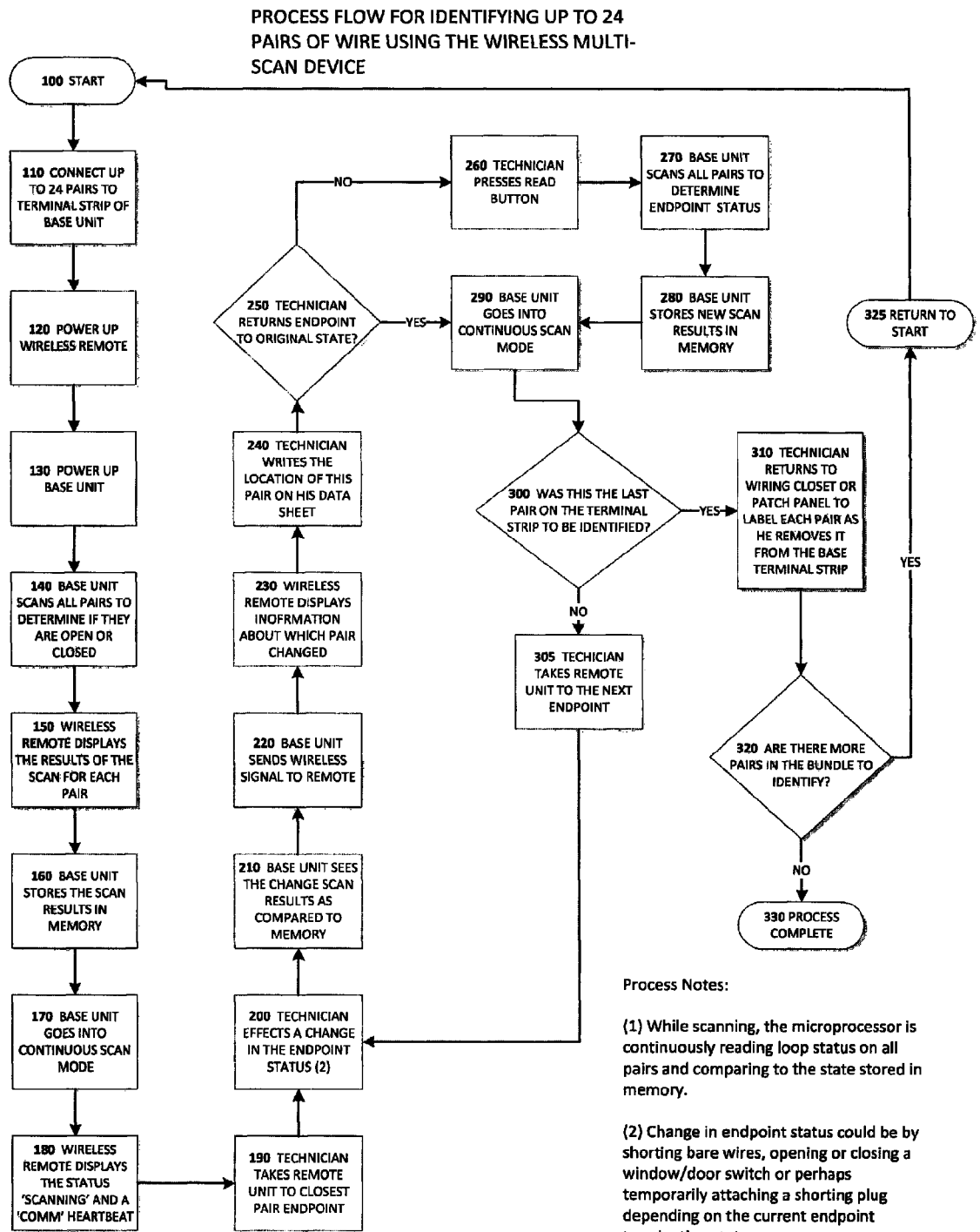
FIG. 2 is an operational flow chart showing the steps involved in using the wire pair identifier for a common application.

FIG. 2 is an operational flowchart of the wireless multi-scan wire pair identifier of the present invention. It describes the logical operation of the device to identify wire pairs 40 in any structure 52. It combines a description of the steps the operating technician takes with the processing that takes place by the base unit 10 and remote unit 28. It allows up to twenty four wire pairs 40 to be identified from their terminal location 40*d* before a single trip is made back to the central wiring closet or panel 52. Referring to FIG. 2, step 100 is the initial start step for details on this procedure.

Once a technician or user identifies the central wiring panel or home-run location 52, the user can start the process.

At step 110, the technician then connects up to twenty four wire pairs 40 from the home-run location 52 to the wire pair connector 26 of the base unit 10. At step 120, the wireless remote 28 is powered up, and at step 130 the base unit 10 is powered up. Next at step 140, the base unit 10 will scan all wire pairs 40 to determine the circuit status whether each wire pair 40 is open or closed. At step 150 the wireless remote 28 will then sequentially display on the LCD 30 the status for each of the wire pairs 40 connected to wire pair connector 26. At step 160, the base unit 10 will store the status of each wire pair 40 at a specific location in memory 14 related to the unique identifier location of a first end 40*c* of wire pairs 40. At step 170, the base unit 28 will then enter into a state where it continuously scans cyclically each wire pair 40 for a change in status. While scanning, the microprocessor 12 is continuously reading loop status on all wire pairs 40 and comparing to the state previously stored in memory 14 to determine any changes in the status of a wire pair 40. Throughout this state, step 180, the wireless remote 28 will display a status of scanning at icon 37.

At step 190, the technician, while holding the wireless remote 28, goes to an endpoint or terminal end of a wire pair 40. At step 200, the technician then creates a change in the endpoint status of a wire pair 40 e.g. by opening or closing a window to change the condition of a wire pair 40. A change in endpoint status could be shorting a bare wire, opening or closing a window 54 or door 56 with a magnetic switch 57 already attached or perhaps temporarily installing a shorting plug as known in the art to the wire pair 40 ends 24*a* and 24*b* to change the status of the second end of a wire pair 40. Once the technician makes a change as described in the previous step, at step 210, the base unit 28 will sense this change while still in its cyclical scanning mode and detects a difference in a present reading from the value stored in memory 14. At step 220, when the base unit 28 detects a change in a wire pair 40, a wireless signal is sent to the remote 28. The wireless remote 28 displays data on the LCD display 30 that informs the technician which of the wire pairs 40 the base unit 10 detected as have a change of status. The technician should then write down on a data sheet 61 the location of the second end 40d of wire pair 40 in column 63 and the identity of the designated wire pair 40 the wireless remote displayed in the previous step e.g. the unique identifier 26b position 07 in column 62.

At step 250, the technician can choose to return the terminal end of wire pair 40, the endpoint to the original state e.g. leave the window open, or leave it in the new state e.g. close the previously opened window and at step 290, the base unit 10 remains in the continuous scan mode. At step 260, if the endpoint remains in the new state, the technician should press the "read" button 35 on the wireless remote 28. At step 270, the base unit 10 will then scan all wire pairs 40 to determine the circuit status of each individual wire pair 40 as it did previously. At step 280, similar to the above description, the base unit 10 will store the scan results in memory 14 for each wire pair 40. At step 290, after storing the new scan results into memory 14, or if the technician returned the endpoint to its original state, the base unit 10 will go back into continuous scan mode as described above.

At step 300, if there are more wire pairs 40 to be identified, then at step 305 the technician should take the wireless remote 28 to the next end point and repeat the process described above starting from step 200. At step 300, if this was the last endpoint or second end 40d to be identified, then at step 310 when all the connected wire pairs 40 have been identified by the method and steps described, the technician returns to the central wiring panel, hub or home-run location 52 and labels the first ends 40c of each wire pair 40 according to the data on sheet 61 as the technician removes and disconnects each of the wire pairs 40 from wire pair connector 26. The labeling of the first ends 40c of wire pairs 40 is as known in the art. At step 320, if there are more wire pairs 40 in the bundle to identify, the technician at step 325 should start the process over from the beginning at step 100 until all wire pairs 40 have been identified. At step 330, once all wire pairs 40 have been identified and labeled, the process is complete.

The present invention is an apparatus for identifying a plurality of wire pairs 40 that originate, at a first end 40c, from a common location 52 and which terminate, at a second end 40d, at remote locations or end points, the apparatus having a wire pair connector 26 including a plurality of pairs of wire connectors 24a and 24b, each pair of wire connectors 24a and 24b for connection to the first end 40c of one wire pair 40, each pair of wire connectors 24a and 24b having an associated unique identifier 26a; a base unit 10 electrically connected 22 to said wire pair connector 26, said base unit 10 including a transceiver 16, a processor 12, and a voltage sensor 21, for applying a voltage to and measuring a voltage across the first ends 40a and 40b of each of wire pairs 40 connected to a pair of wire connectors 24a and 24b; the base unit 10 further including a memory device 14 for storing a voltage reading measured across each of the wire pairs 40; a remote unit 28 having a transceiver 34 for communicating with the base unit 10 transceiver 16 and an output device 30, for communicating an output indication; the processor 12 configured to compare a current voltage measurement for each of the wire pairs 40 to a prior voltage reading stored in the memory device 14 for each of the wire pairs 40 and to communicate to the remote unit 28, via the transceiver 16, a unique identifier 26a associated with a pair of wire connectors 24a and 24b exhibiting a voltage change.

It is to be understood that the preceding is merely a detailed description of the invention, and that alterations to the disclosed invention can be made in accordance with the disclosure without departing from the spirit and scope of the invention. The preceding description is not meant to limit the scope of the invention. The scope of the invention is to be determined by the appended claims and their equivalents.

We claim:

1. A wireless multi-scan wire identifying apparatus for identifying a wire pair of a plurality of wire pairs that originate from a common location and that terminate at individual remote locations comprising:

a portable base unit including a power supply, a terminal strip, a wireless transceiver, a microprocessor and memory storage;

said terminal strip of the portable base unit communicating with said portable base unit, said terminal strip including a plurality of wire pair connectors for connection to wire pairs of a bundle of wires, said power supply of said portable base unit adapted to supply voltage to said plurality of wire pair connectors, each pair of said plurality of wire pair connectors having a unique identifier;

said microprocessor of said portable base unit configured to perform a sequential scanning of a voltage across a selected one of said plurality of wire pairs, for measuring each said voltage on said selected wire pair, for storing a value corresponding to said measured voltage in memory at a unique location corresponding to each of said wire pairs, and for comparing the value of each voltage reading with a prior stored value to determine whether a change in a voltage reading has occurred;

a wireless remote unit having a wireless transceiver for receiving a signal from said portable base unit, said wireless transceiver indicating when said one of said plurality of wire pairs has had a change in status, and said wireless remote displaying said unique identifier of said wire pair which has had a change of state on a screen located on said wireless remote.

2. A wireless multi-scan wire identifying apparatus as in claim 1, wherein each of said wire pairs has two or more internal wires, a first end of each of said two internal wires for each of said wire pairs electrically connected to said wire pair connector, said wire pair connector electrically connected to said portable base unit and said wire pairs include wires from a pair of wires, coaxial cabling or data cables.

3. A wireless multi-scan wire identifying apparatus as in claim 1, including a read button located on said wireless remote unit, said microprocessor configured to detect a pressing of said read button and, in response to a detection of a read button press, to engage in a global scan including all said wire pairs, updating all said stored values in said memory.

4. A wireless multi-scan wire identifying apparatus as in claim 1 where said screen includes an icon adapted to blink if communication is satisfactory between said portable base unit and said wireless remote unit.

5. A method for identification of a plurality of wire pairs forming a bundle of wires that originate from a common location and that terminate at remote locations comprising the steps of:

a) connecting first ends of a plurality of wire pairs of the bundle to a wire connector terminal strip of a portable base unit;

b) with a microprocessor of the portable base unit, sequentially applying a voltage across each of said wire pairs connected to the terminal strip;

c) measuring, with the microprocessor of the portable base unit, the voltage of each said wire pairs and storing a value corresponding to said voltage in memory;

d) continuing to sequentially apply and measure the voltage across said wire pairs;

e) cyclically comparing the most recent value measured across a wire pair to the earlier value stored in memory for each of the plurality of wire pairs; and f) communicating to a remote unit whether there has been a change in the voltage value measured across a given wire pair.

6. A method for identification of a plurality of wire pairs as in claim 5, further including the step of causing a change to occur in a second end of one of said wire pairs.

7. A method for identification of a plurality of wire pairs as in claim 6, wherein the identity of said given wire pair is communicated from said common location to one of said remote locations.

8. A method for identification of a plurality of wire pairs as in claim 7, recording the identity of said wire pair at one of said remote locations.

9. An apparatus for identifying a plurality of wire pairs forming a bundle of wires that originate, at a first end, from a common location and which terminate, at a second end, at remote locations, the apparatus comprising:

a portable base unit including a wire pair connector terminal, a transceiver, a processor, and a voltage sensor;

said wire pair connector terminal including a plurality of wire pair connectors for connection to a first end of one wire pair, each pair of said wire pair connectors having an associated unique identifier;

said portable base unit configured to apply a voltage across each of said wire pairs connected to said wire pair connector terminal and to measure a voltage across each of said wire pairs;

said base unit further including a memory device for storing a voltage status measured across each of said wire pairs;

a remote unit having a transceiver for communicating with said base unit transceiver and an output device, for communicating an output indication;

said processor configured to compare a current voltage status for each of said wire pairs to a prior voltage status stored in said memory device for each of said wire pairs and to communicate to said remote unit, via said portable base unit transceiver, said unique identifier associated with said wire connector exhibiting a voltage change.

10. An apparatus for identifying a plurality of wire pairs as in claim 9, wherein said portable base unit transceiver is only a transmitter and said remote unit transceiver is only a receiver.

11. An apparatus for identifying a plurality of wire pairs as in claim 9, wherein said output device displays information about said output indication.

12. An apparatus for identifying a plurality of wire pairs as in claim 9, wherein said wire pairs are cables having two or more wires, said wire pairs being arranged in a star wired topology such that said common location is located within a structure and said remote locations are generally throughout said structure.

13. An apparatus for identifying a plurality of wire pairs as in claim 9, wherein the second ends of said wire pairs are attached or intended to be attached to an electrical device at said remote location.

14. An apparatus for identifying a plurality of wire pairs as in claim 9, wherein said common location includes a panel and said portable base unit releasably attaches to said panel.

15. An apparatus for identifying a plurality of wire pairs as in claim 9, wherein communication between said base unit and said remote unit is by RF signal or WI-FI or cellular signal.

16. An apparatus for identifying a plurality of wire pairs as in claim 9, wherein said remote unit is a smart phone or an electronic tablet device.

17. An apparatus for identifying a plurality of wire pairs as in claim 9, wherein said voltage is applied across the first ends of all of said wire pairs connected to said wire pair connector terminal and said processor measures said voltage across each of said wire pairs one at a time.

18. An apparatus for identifying a plurality of wire pairs as in claim 9, wherein a read control in said remote unit communicates an instruction to said processor in said portable base unit initiating sequential measurements of a new voltage status across the first ends of each of said wire pairs connected to said wire pair connector terminal and storing said new measured voltage status measured across each of said wire pairs in the same memory location of the said prior voltage status stored in said memory device for each of said wire pairs until a new voltage status is stored in memory for each of said wire pairs; and thereafter continuing to compare a current voltage status for each of said wire pairs to said prior voltage status stored in the memory device for each said wire pair.

19. A wireless multi-scan wire identifying apparatus for identifying a wire pair of a plurality of wire pairs that originate from a common location and that terminate at individual remote locations comprising:

a portable base unit including a power supply, a plurality of wire pair connectors, a wireless transceiver, a microprocessor and memory storage;

each of said plurality of wire pair connectors configured to connect to one wire pair of the plurality of wire pairs at the common location, said power supply of said portable base unit adapted to supply voltage to said plurality of wire pair connectors, each of said plurality of wire pair connectors having a unique identifier;

said microprocessor of said portable base unit performing a sequential scanning of a voltage across the plurality of wire pairs, for measuring a voltage on each of the wire pairs, for storing a value corresponding to said measured voltage in memory of the portable base unit at a unique location corresponding to each of said wire pairs, and for comparing the value of each voltage reading with a prior stored value to determine whether a change in a voltage reading has occurred;

a wireless remote unit having a wireless transceiver for receiving a signal from said portable base unit, said wireless transceiver indicating when said one of said plurality of wire pairs has had a change in status, and said wireless remote displaying said unique identifier of said wire pair which has had a change of state on a screen located on said wireless remote.

20. An apparatus for identifying a plurality of wire pairs as in claim 19, wherein said common location includes a panel and said portable base unit releasably attaches to said panel.

21. A wireless multi-scan wire identifying apparatus as in claim 20, wherein each of said wire pairs is cat5 cabling.

* * * * *